[19] Hirooka et al.

[11] Patent Number: 4,869,931
[45] Date of Patent: Sep. 26, 1989

[54] METHOD FOR FORMING DEPOSITED FILMS OF GROUP II-VI COMPOUNDS

[75] Inventors: Masaaki Hirooka, Toride; Masahiro Kanai, Tokyo; Jun-Ichi Hanna; Isamu Shimizu, both of Yokohama, all of Japan

[73] Assignee: Canon Kabushiki Kaisha, Tokyo, Japan

[21] Appl. No.: 298,219

[22] Filed: Jan. 17, 1989

Related U.S. Application Data

[63] Continuation of Ser. No. 941,425, Dec. 15, 1986, abandoned.

[30] Foreign Application Priority Data

Dec. 16, 1985 [JP] Japan .................. 60-282201

[51] Int. Cl.$^4$ .............. C23C 16/30; C23C 16/40
[52] U.S. Cl. ................. 427/255.2; 427/126.1; 427/126.2; 427/255; 427/255.3
[58] Field of Search ............ 427/126.3, 126.2, 126.1, 427/255, 255.2, 255.3; 437/225

[56] References Cited

U.S. PATENT DOCUMENTS

| | | | |
|---|---|---|---|
| Re. 31,708 | 10/1984 | Gordon | 427/126.2 |
| 2,552,626 | 5/1951 | Fisher et al. | 201/64 |
| 3,083,550 | 4/1963 | Auerbach | 65/3 |
| 3,188,230 | 6/1965 | Bakish et al. | 117/107.1 |
| 3,203,827 | 8/1965 | Hill | 117/107.2 |
| 3,218,204 | 11/1965 | Ruehrwein | 427/255.2 |
| 3,224,912 | 12/1965 | Ruehrwein | 427/255.2 |
| 3,306,768 | 2/1967 | Peterson | 117/108 |
| 3,466,191 | 9/1969 | Stinchfield et al. | 427/255.3 |
| 3,506,556 | 4/1970 | Illery et al. | 204/192 |
| 3,655,429 | 4/1972 | Deklerk | 427/255.2 |
| 3,664,866 | 5/1972 | Manasevit | 427/255.2 |
| 3,850,679 | 11/1974 | Sopko et al. | 427/255.3 |
| 3,870,558 | 3/1975 | Shimizu et al. | 427/255.3 |
| 3,984,587 | 10/1976 | Lipp | 427/70 |
| 4,058,430 | 11/1977 | Suntola et al. | 156/611 |
| 4,146,657 | 3/1979 | Gordon | 427/126 |
| 4,180,596 | 12/1979 | Crowder et al. | 427/42 |
| 4,206,252 | 6/1980 | Gordon | 427/160 |
| 4,239,811 | 12/1980 | Kemlage | 427/95 |
| 4,328,261 | 5/1982 | Heinecke et al. | 427/91 |
| 4,357,179 | 11/1982 | Adams et al. | 148/1.5 |
| 4,359,490 | 11/1982 | Lehrer | 427/95 |
| 4,402,762 | 9/1983 | John et al. | 148/1.5 |
| 4,416,217 | 11/1983 | Nakamura et al. | 118/696 |
| 4,448,801 | 5/1984 | Fukuda et al. | 427/39 |
| 4,515,107 | 5/1985 | Fournier et al. | 118/718 |
| 4,522,663 | 6/1985 | Ovshinsky et al. | 148/403 |
| 4,526,809 | 7/1985 | Hall et al. | 427/87 |
| 4,529,679 | 7/1985 | Ogawa et al. | 430/84 |
| 4,554,180 | 11/1985 | Hirooka | 427/248.1 |
| 4,595,601 | 6/1986 | Horioka et al. | 427/53.1 |
| 4,615,905 | 10/1986 | Ovshinsky | 427/39 |
| 4,637,938 | 1/1987 | Lee et al. | 427/53.1 |
| 4,650,539 | 3/1987 | Irvine et al. | 427/255.2 |
| 4,652,463 | 3/1987 | Peters | 427/53.1 |

FOREIGN PATENT DOCUMENTS 2038086A 7/1980 United Kingdom.

*Primary Examiner*—Sadie Childs
*Attorney, Agent, or Firm*—Fitzpatrick, Cella, Harper & Scinto

[57] ABSTRACT

A method for forming a deposited film, which comprises introducing a gaseous starting material containing an element in the Group II of the periodic table, a starting material containing an element in the Group VI of the periodic table which are gasifiable for formation of a deposited film, and a gaseous halogenic oxidizing agent having the property of oxidation action on said starting materials into a reaction space to effect contact therebetween to thereby chemically form a plural number of precursors containing precursors under excited state, and forming a deposited film on a substrate existing in a film-forming space by the use of at least one precursor of said precursors as the feeding source for the constituent element of the deposited film.

8 Claims, 1 Drawing Sheet

METHOD FOR FORMING DEPOSITED FILMS OF GROUP II-VI COMPOUNDS

This application is a continuation of application Ser. No. 941,425 filed Dec. 15, 1986 now abandoned.

BACKGROUND OF THE INVENTION

1. Field of the Invention

This invention relates to a method for formation of a functional film, particularly a functional deposited film which is useful for in semiconductor devices, photosensitive devices for electrophotography, electronic device such as optical input sensor devices for optical image inputting device, etc.

2. Related Background Art

In the prior art, for amorphous or polycrystalline functional films such as semiconductor films, insulating films, photoconductive films, magnetic films or metal films, individually suitable film-forming methods have been employed from the standpoint of desired physical characteristics, uses, etc.

For formation of deposited films, there have been attempted the vacuum vapor deposition method, the plasma CVD method, the thermal CVD method, the optical CVD method, the reactive sputtering method, the ion plating method, etc. Generally, the plasma CVD method has been widely used and industrialized.

However, the deposited films obtained according to these methods for formation of deposited films have been demanded to be used in electronic devices or photoelectronic devices for which higher functions are required, and therefore there is room for further improvement in their overall characteristics with respect to electrical and optical characteristics, and fatigue characteristic or environmental resistance characteristic on repeated use, and further productivity, bulk productivity, including uniformness, reproducibility, etc.

The reaction process in formation of a deposited film according to the plasma CVD method which has been generalized in the prior art is considerably more complicated than the thermal CVD method of the prior art, and its reaction mechanism involves several ambiguities. Also, there are a large number of parameters in the formation of a deposited film (for example, substrate temperature, flow rate and flow rate ratio of the introduced gases, pressure during formation, high frequency power, electrode structure, structure of the reaction vessel, speed of evacuation, plasma generating system, etc.). Because of the combination of such a large number of parameters, the plasma may sometimes become unstable, whereby significant deleterious influences are exerted frequently on the deposited film formed. Besides, the parameters characteristic of the device must be selected for each device and therefore under the present situation it has been difficult to generalize the production conditions.

Also, depending on the application use of the deposited film, bulk production having reproducibility must be obtained with full satisfaction of enlargement of area, uniformity of film thickness as well as uniformity of film quality, and therefore in formation of a deposited film according to the plasma CVD method, enormous installation investment is required for a bulk production device and also controls for such bulk production become complicated, with the management tolerance being narrow and the control of the device being severe. These are pointed out as the problems to be improved in the future.

Further, according to the the conventional prior art CVD method, high temperature is required and a deposited film having satisfactory characteristics on industrial level could not necessarily be obtained.

These remain as the more significant problems particularly in the case of forming a thin film of Group II-VI compounds.

As described above, in formation of functional films, it has been earnestly desired to develop a method for forming a deposited film which is capable of bulk production by means of a device of low cost, while maintaining the characteristics as well as uniformity which are practicably available.

SUMMARY OF THE INVENTION

An object of the present invention is to remove the drawbacks of the method for forming deposited films as described above and at the same time to provide a novel method for forming a deposited film without use of the formation method of the prior art.

Another object of the present invention is to attempt to save energy and at the same time to provide a method for forming a deposited film capable of obtaining a deposited film with uniform characteristics over a large area with easy management of film quality.

Still another object of the present invention is to provide a method for forming a deposited film by which a film excellent in productivity and bulk productivity, having high quality as well as excellent physical characteristics such as electrical, optical and semiconductor characteristics can be easily obtained.

The method for forming a deposited film of the present invention which can accomplish the above objects comprises introducing a gaseous starting material containing an element Group II of the periodic table, a starting material containing an element in the Group VI of the periodic table which are gasifiable for formation of a deposited film, and a gaseous halogenic oxidizing agent having the property of oxidation action on said starting materials into a reaction space to effect contact therebetween to thereby chemically form precursors under excited state, and forming a deposited film on a substrate existing in a film-forming space by the use of said precursors as the feeding source for the constituent element of the deposited film.

DESCRIPTION OF THE PREFERRED EMBODIMENT

Figure 1:
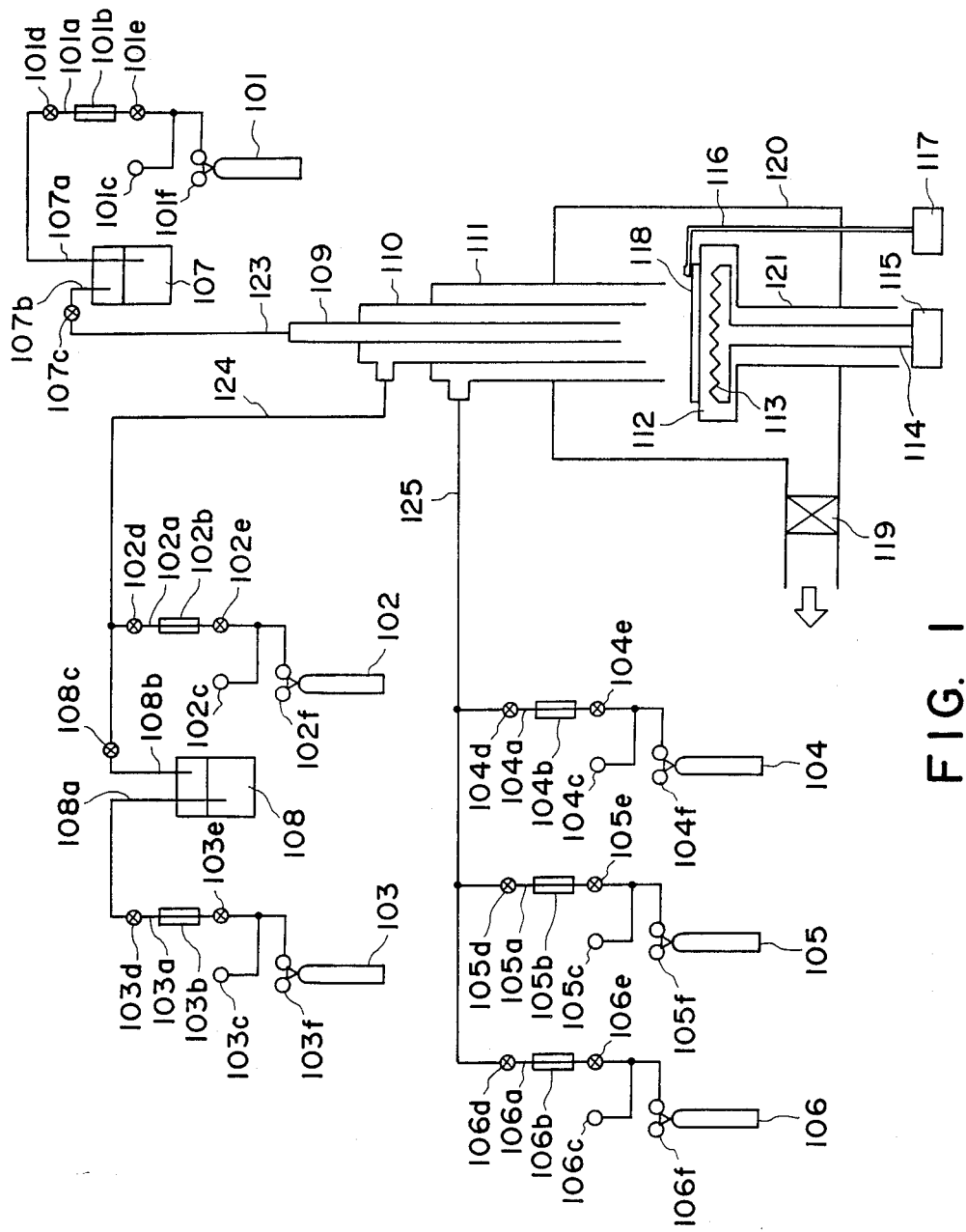
FIG. 1 is a schematic illustration of a film forming device used in the Examples of the present invention.

According to the method for forming a deposited film of the present invention, simplification of management and bulk production can be effected with full satisfaction of enlargement of area, uniformity of film thickness, and uniformity of film quality simultaneously with saving energy, without requiring an enormous installation investment for bulk production apparatus, and also the management items for its bulk production become clear to afford broad latitude in management tolerance and simple control of the device.

In the method for forming a deposited film of the present invention, the starting material containing an element of Group II of the periodic table and the starting material containing an element of Group VI of the periodic table which are gasifiable for formation of a deposited film are oxidized action through contact with a gaseous halogenic oxidizing agent and can be selected suitably as desired depending on the kind, the characteristic, use, etc., of the desired deposited film. In the present invention, the above gaseous starting materials and the gaseous halogenic oxidizing agent may be those which can be made gaseous when being introduced and contacted with each other, and they can be either liquid or solid in ordinary state.

When the starting materials for formation of a deposited film or the halogenic oxidizing agent is liquid or solid, the starting materials for formation of a deposited film and the halogenic oxidizing agent are introduced in gaseous state into the reaction space while performing bubbling with the use of carrier gas such as Ar, He, $N_2$, $H_2$, etc., optionally with application of heat.

During this operation, the partial pressures and mixing ratio of the above gaseous starting materials and the gaseous halogenic oxidizing agent can be set by controlling the flow rate of the carrier gas and the vapor pressures of the starting materials for formation of the deposited film and the gaseous halogenic oxidizing agent.

As the starting materials for formation of a deposited film to be used in the present invention, for example, for the purpose of obtaining deposited films of Group II-VI compounds having semiconductivity, there may be included organometallic compounds containing Group II elements, particularly alkyl compounds and hydrides, halides or organometallic compounds of Group VI elements, particularly alkyl compounds, as effective ones.

Specific examples may include, as the compounds containing Group II elements, $Zn(CH_3)_2$, $Zn(C_2H_5)_2$, $Zn(OCH_3)_2$, $Zn(OC_2H_5)_2$, $Cd(CH_3)_2$, $Cd(C_2H_5)_2$, $Cd(C_3H_7)_2$, $Cd(C_4H_9)_2$, $Hg(CH_3)_2$, $Hg(C_2H_5)_2$, $Hg(C_6H_5)_2$, $Hg[C\equiv C(C_6H_5)]_2$, as the compounds containing Group VI elements, $NO$, $N_2O$, $CO_2$, $CO$, $H_2S$, $SCl_2$, $S_2Cl_2$, $SOCl_2$, $SeH_2$, $SeCl_2$, $Se_2Br_2$, $Se(CH_3)_2$, $Se(C_2H_5)_2$, $TeH_2$, $Te(CH_3)_2$, $Te(C_2H_5)_2$.

Of course, these starting materials may be used either singularly or as a mixture of two or more kinds.

The halogenic oxidizing agent to be used in the present invention is made gaseous on the introduction into the reaction space and at the same time has the property of effectively oxidizing the gaseous starting materials for formation of a deposited film introduced into the reaction space by mere contact therewith, including halogenic gas such as $F_2$, $Cl_2$, $Br_2$, $I_2$, etc., and fluorine, chlorine, bromine, etc., under nascent state as effective ones.

These halogenic oxidizing agents are introduced into the reaction space under gaseous state together with the gases of the starting materials for formation of a deposited film as described above at a desired flow rate and a feeding pressure, wherein they mix with and collide against the above starting materials, thereby oxidizing the above starting materials to generate efficiently a plurality of precursors including precursors under excited state. Of the precursors under excited state and other precursors generated, at least one of them functions as the feeding source for the constituent element of the deposited film formed.

The precursors generated may undergo decomposition or reaction to be converted to other precursors under excited state or to precursors under another excited state, or alternatively in their original forms, if desired, although releasing energy to contact the substrate surface arranged in a film-forming space, whereby a deposited film having a three-dimensional network structure is prepared when the substrate surface temperature is relatively low or a crystalline deposited film is prepared when the substrate surface temperature is higher.

In the present invention, so that the film forming process may proceed smoothly to form a film of high quality and having desired physical characteristics, as the film forming factors, the kinds and combination of the starting materials and the halogenic oxidizing agent, mixing ratio of these, pressure during mixing, flow rate, the inner pressure in the film-forming space, the flow types of the gases, the film forming temperature (substrate temperature and atmosphere temperature) are suitably selected as desired. These film-forming factors are interrelated, and they are not determined individually but determined with respect to their interrelationship. In the present invention, the ratio of the gaseous starting materials for formation of a deposited film and the gaseous halogenic oxidizing agent introduced into the reaction space may be determined suitably as desired in relation with the related the film-forming factors as mentioned above. The ratio is preferably 1/20 to 100/1, more preferably 1/5–50/1 in terms of flow rate ratio introduced.

The pressure during mixing on the introduction into the reaction space may be preferably higher in order to make higher the probability of contact between the above gaseous starting materials and the above gaseous halogenic oxidizing agent in probability. It is better to determine the optimum value suitably as desired in view of the reactivity. Although the pressure during mixing may be determined as described above, each of the pressures during introduction may be preferably $1 \times 10^{-7}$ atm to 5 atm, more preferably $1 \times 10^{-6}$ atm to 2 atm.

The pressure within the film forming space, namely the pressure in the space in which the substrate for forming a film thereon is arranged, may be set suitably as desired so that the precursors (E) under the state generated in the reaction space and sometimes the precursors (D) formed as secondary products from said precursors (E) may contribute effectively to film formation.

The inner pressure in the film forming space, when the film-forming space is open and continuous with the reaction space, can be controlled in relationship with the introduction pressures and flow rates of the gaseous starting materials for formation of a deposited film and a gaseous halogenic oxidizing agent in the reaction space, for example, by application of a contrivance such as differential evacuation or use of a large scale evacuating device.

Alternatively, when the conductance at the connecting portion between the reaction space and the film-forming space is small, the pressure in the film-forming space can be controlled by providing an appropriate evacuating device in the film-forming space and controlling the evacuation degree of said device.

On the other hand, when the reaction space and the film-forming space are integral and the reaction position and the film-forming position are only spatially different, it is possible to effect differential evacuation or provide a large scale evacuating device having sufficient evacuating capacity as described above.

As described above, the pressure in the film-forming space may be determined in relationship with the introduction pressures of the gaseous starting materials and the gaseous halogenic oxidizing agent introduced into the reaction space. The pressure is preferably 0.001 Torr to 100 Torr, more preferably 0.01 Torr to 30 Torr, optimally 0.05 to 10 Torr.

As for the flow type of the gases, it is necessary to design the flow type in view of the geometric arrangement of the gas introducing inlet, the substrate, and the gas evacuating outlet so that the starting materials for formation of a deposited film and the halogenic oxidizing agent may be efficiently mixed during introduction of these into the reaction space, the above precursors (E) may be efficiently generated, and the film formation may be adequately carried out without trouble. A preferable example of the geometric arrangement is shown in FIG. 1.

The substrate temperature (Ts) during the film formation, can be set suitably as desired individually depending on the gas species employed, and the kinds and the required characteristics of the deposited film formed. In the case of obtaining an amorphous film, it is preferably from room temperature to 450° C., more preferably from 50° to 400° C. Particularly, in the case of forming a crystalline deposited film having better semiconductor characteristics and photoconductive characteristics, etc., the substrate temperature (Ts) should desirably be 300° to 600° C.

As the atmospheric temperature (Tat) in the film-forming space, it may be determined suitably as desired in relationship with the substrate temperature (Ts) so that the above precursors (E) generated and the above precursors (D) can not be changed to unsuitable chemical species for film formation, and also the above precursors (E) may be efficiently generated.

The substrate to be used in the present invention may be either electroconductive or electrically insulating, provided that it is selected as desired depending on the use of the deposited film formed. As the electroconductive substrate, there may be mentioned metals such as NiCr, stainless steel, Al, Cr, Mo, Au, In, Ir, Nb, Ta, V, Ti, Pt, Pd etc. or alloys thereof.

As insulating substrates, there may be conventionally used films or sheets of synthetic resins, including polyester, polyethylene, polycarbonate, cellulose acetate, polypropylene, polyvinyl chloride, polyvinylidene chloride, polystyrene, polyamide, etc., glasses, ceramics, and so on. At least one side surface of these insulating substrates is preferably subjected to a treatment for imparting electroconductivity, and it is desirable to provide other layers on the side to which said electroconductive treatment has been applied.

For example, an electroconductive treatment of glass can be effected by providing a thin film of NiCr, Al, Cr, Mo, Au, In, Ir, Nb, Ta, V, Ti, Pt, Pd, $In_2O_3$, $SnO_2$, ITO ($In_2O_3+SnO_2$) on the surface thereof. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, In, Ir, Nb, Ta, V, Ti, Pt, etc., or by a laminating treatment with said metal, thereby imparting electroconductivity to the surface. The substrate may be shaped in any form such as cylinders, belts, plates or others, and its form may be determined as desired.

The substrate should be preferably selected from among those set forth above in view of adhesion and reactivity between the substrate and the film. Further, if the difference in thermal expansion between both is great, a large amount of strain may be created within the film to give sometimes a film of poor quality, and therefore it is preferable to use a substrate so that the difference in thermal expansion is small.

Also, the surface state of the substrate is directly related to the structure of the film (orientation) or generation of a stylet structures, and therefore it is desirable to treat the surface of the substrate so that a film structure and a film texture which give desired characteristics may be obtained.

FIG. 1 shows an example of a preferable device for practicing the method for forming a deposited film of the present invention.

The deposited film forming device shown in FIG. 1 is broadly classified into the three to sections: a main device, an evacuation system, and a gas feeding system.

In the main device, a reaction space and a film forming space are provided.

101–106 are respectively bombs filled with the gases to be used during the film formation, 101a–106a are respectively gas feeding pipes, 101b–106b are respectively mass flow controllers for controlling the flow rates of the gases from the respective bombs, 101c–106c are respectively gas pressure gauges, 101d–106d and 101e–106e are respectively valves, and 101f–106f are respectively pressure gauges indicating the pressures in the corresponding gas bombs.

107 and 108 are vessels for containing liquid and solid starting materials having heating means (not shown in this Figure) to be used, if necessary, 107a, 108a, 107b and 108b gas feeding pipes, and 107c and 108c stop valves.

120 is a vacuum chamber equipped at the upper portion with a pipeline for gas introduction, having a structure for formation of the reaction space downstream of the pipeline, and also having a structure for formation of a film-forming space in which a substrate holder 112 is provided so that a substrate 118 may be provided opposite the gas discharging outlet of said pipeline. The pipeline for gas introduction has a triple concentric arrangement structure, having from the innerside a first gas introducing pipe 109 for introducing the gas from the gas bomb 101 and the starting material from 107, a second gas introducing pipe 110 for introducing the gases from the gas bombs 102 and 103 and the starting material from 108, and a third gas introducing pipe 111 for introducing the gases from the gas bombs 104–106.

For gas evacuation to the reaction space of each gas introducing pipe, each position is designed so as to be arranged at a position further from the surface position of the substrate as the pipe is nearer to the inner side. In other words, the gas introducing pipes are arranged so that the pipe on the outer side may enclose the pipe existing within the innerside thereof.

The gases from the respective bombs are fed into the respective introducing pipes through the gas feeding pipelines 123–125, respectively.

The respective gas introducing pipes, the respective gas feeding pipelines, and the vacuum chamber 120 are evacuated to vacuum through the main vacuum valve 119 by means of a vacuum evacuating device not shown.

The substrate 118 is set at a suitably desired distance from the positions of the respective gas introducing pipes by moving vertically the substrate holder 112.

In the case of the present invention, the distance between the substrate and the gas discharging outlet of the gas introducing pipe may be determined appropriately in view of the kinds and the desired characteristics of the deposited film formed, the gas flow rates, the inner pressure in the vacuum chamber, etc. It is preferably several mm to 20 cm, more preferably 5 mm to about 15 cm.

113 is a heater for heating the substrate which is provided in order to heat the substrate to an appropriate temperature during film formation, to preheat the substrate 118 before film formation, or further to anneal the film after film formation.

The substrate heating heater 113 is supplied with power through a conductive wire 114 from a power source 115.

116 is a thermocouple for measuring the substrate temperature (Ts) and is electrically connected to the temperature display device 117.

The present invention described in more detail by referring to the following Examples.

EXAMPLE 1

By use of the film forming device shown in FIG. 1, a deposited film was prepared according to the process of the present invention as described below.

He gas filled in the bomb 101 was blown at a flow rate of 20 sccm into the starting material vessel 107 containing $Zn(CH_3)_2$ to effect bubbling therein and the gasified $Zn(CH_3)_2$ was fed together with the He gas through the gas introducing pipe 109 at about 0.001 mol/min., the $SeH_2$ gas filled in the bomb 102 at a flow rate of 30 sccm, the $F_2$ gas filled in the bomb 106 at a flow rate of 5 sccm, and the He gas filled in the bomb 105 at a flow rate of 40 sccm through the gas introducing pipe 111 into the vacuum chamber 120.

During this operation, the pressure in the vacuum chamber 120 was made 800 mTorr by controlling the opening of the vacuum valve 119. A quartz glass (15 cm × 15 cm) was used for the substrate, and the distance between the gas introducing inlet 111 and the substrate was set at 3 cm.

Reddish purple luminescence was observed in the mixing region of $Zn(CH_3)_2$ gas, $SeH_2$ gas, and $F_2$ gas. The substrate temperature (Ts) was set in the range of room temperature to 600° C. for respective samples as indicated in Table 1.

When gases were permitted to flow under such conditions for 3 hours, Zn:Se:F films having film thicknesses as shown in Table 1 were deposited on the substrate.

The distribution irregularity of the film thickness was within the range of ±5%. The samples of the Zn:Se:F film formed of Sample No. 1-1 to 1-4 were confirmed to be amorphous, and that of Sample No. 1-5 to be crystalline, by electron beam diffraction.

The layer thickness of each sample was determined with a film thickness measuring apparatus of alpha-step (produced by TENCOR Co.).

On the amorphous or crystalling Zn:Se:F film of each sample, a comb-shaped electrode (gap length 200 μm) of aluminum was vapor deposited to prepare a sample for measurement of electroconductivity. Each sample was placed in a vacuum cryostat, a voltage of 100 V was applied and the current was measured by a minute amperemeter (YHP4140B) produced by YOKOKAWA HEWLETT-PACKARD Company to determine the dark electroconductivity ($\sigma d$). Also, light of 600 nm and 0.3 mw/cm² was irradiated to determine the photoconductivity ($\sigma p$). Further, from absorption of light, the optical band gap ($Eg_{opt}$) was determined. These results are shown in Table 1.

TABLE 1

| Sample No. | 1-1 | 1-2 | 1-3 | 1-4 | 1-5 |
|---|---|---|---|---|---|
| Substrate temperature (°C.) | 28 | 120 | 200 | 450 | 600 |
| Film thickness (μm) | 2.5 | 2.0 | 1.8 | 1.5 | 1.5 |
| $\sigma d$ (s/cm) | $1.5 \times 10^{-12}$ | $2 \times 10^{-12}$ | $3 \times 10^{-12}$ | $5 \times 10^{-12}$ | $6 \times 10^{-12}$ |
| $\sigma p$ (s/cm) | $8 \times 10^{-9}$ | $8 \times 10^{-8}$ | $2 \times 10^{-7}$ | $5 \times 10^{-7}$ | $3 \times 10^{-7}$ |
| $Eg_{opt}$ (eV) | 2.20 | 2.38 | 2.43 | 2.60 | 2.82 |

Each sample was subjected to spectrophotometric determination with a spectrophotometer (produced by HITACHI-SEISAKUSHO No. 330). $Eg_{opt}$ was calculated from the results by the usual TAUC plot method.

EXAMPLE 2

Example 1 was repeated except that $H_2S$ was employed in place of $SeH_2$, and that the film formation was conducted at two substrate temperatures of 400° C. and 600° C.

The film forming conditions employed are as follows:
He from bomb 101: 20 sccm
Amount of Zn $(CH_3)_2$ evaporated: 0.001 mol/min.
$H_2S$: 15 sccm
$F_2$: 5 sccm
He from bomb 105: 40 sccm
Inner pressure: 800 mTorr
Substrate temperature: 400° C., 600° C.
Distance between gas blowing outlet and substrate: 3 cm Similarly as in Example 1, strong blue luminescence was observed in the region where $Zn(CH_3)_2$, $H_2S$, $F_2$ gas were merged into one stream. After gas blowing for 3 hours, a Zn:S:F film of about 1.8 μm thickness was deposited on the quartz glass substrate.

The films were found to be amorphous when the substrate temperature was 400° C. and crystalline when the substrate temperature was 600° C. as confirmed by electron beam diffraction.

After an aluminum comb-shaped electrode (gap length 200 μm) was vapor deposited in vacuo on the Zn:S:F film, the sample was placed in a vacuum cryostat, and dark electroconductivity ($\sigma d$), electroconductivity ($\sigma p$) when irradiated with light of 600 nm and 0.3 mw/cm² and the optical band gap ($Eg_{opt}$) by measurement of optical absorption were measured, respectively.

The obtained values were as follows:

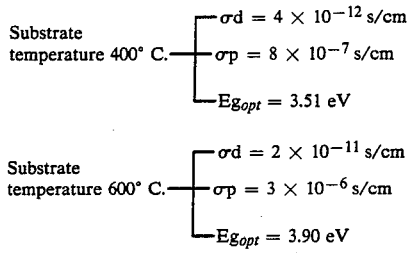

Substrate temperature 400° C.
- $\sigma d = 4 \times 10^{-12}$ s/cm
- $\sigma p = 8 \times 10^{-7}$ s/cm
- $Eg_{opt} = 3.51$ eV Substrate temperature 600° C.
- $\sigma d = 2 \times 10^{-11}$ s/cm
- $\sigma p = 3 \times 10^{-6}$ s/cm
- $Eg_{opt} = 3.90$ eV The film thickness, $\delta d$, $\delta p$, and $Eg_{opt}$ were measured in the same manner as in Example 1.

EXAMPLE 3

Example 1 was repeated except that the film formation was conducted by introducing TeH$_2$ gas in place of introducing SeH$_2$ gas.

The film forming conditions employed are as follows:
He from bomb 101: 20 sccm
Amount of Zn(CH$_3$)$_2$ evaporated: 0.001 mol/min.
TeH$_2$: 10 sccm
F$_2$: 5 sccm
He from bomb 105: 40 sccm
Inner pressure: 800 mTorr
Substrate temperature: 400° C., 600° C.
Distance between gas blowing outlet and substrate: 3 cm Reddish purple luminescence was observed in the region where Zn(CH$_3$)$_2$, TeH$_2$, and F$_2$ gas were merged into one stream. After gas blowing for 3 hours, a Zn:Te:F film of about 1.3 μm thickness was deposited on the quartz glass substrate.

The films were found to be amorphous when the substrate temperature was 400° C. and crystalline when the substrate temperature was 600° C. as confirmed by electron beam diffraction.

After an aluminum comb-shaped electrode (gap length 200 μm) was vapor deposited in vacuo on the Zn:Te:F film, the sample was placed in a vacuum cryostat, and dark electroconductivity ($\sigma d$), electroconductivity ($\sigma p$) when irradiated with light of 600 nm and 0.3 mw/cm$^2$ and the optical band gap ($Eg_{opt}$) by measurement of optical absorption were measured, respectively.

The obtained values were as follows:

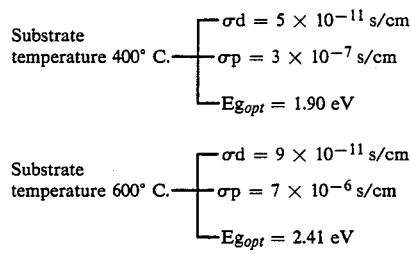

Substrate temperature 400° C.
- $\sigma d = 5 \times 10^{-11}$ s/cm
- $\sigma p = 3 \times 10^{-7}$ s/cm
- $Eg_{opt} = 1.90$ eV Substrate temperature 600° C.
- $\sigma d = 9 \times 10^{-11}$ s/cm
- $\sigma p = 7 \times 10^{-6}$ s/cm
- $Eg_{opt} = 2.41$ eV The film thickness, $\delta d$, $\delta p$, and $Eg_{opt}$ were measured in the same manner as in Example 1.

EXAMPLE 4

Example 1 was repeated except that film formation was conducted by introducing N$_2$O gas in place of introducing SeH$_2$ gas.

The film forming conditions employed are as follows:
He from bomb 101: 20 sccm
Amount of Zn(CH$_3$)$_2$ evaporated: 0.001 mol/min.
N$_2$O: 20 sccm
F$_2$: 5 sccm
He from bomb 105: 40 sccm
Inner pressure: 800 mTorr
Substrate temperature: 400° C., 600° C.
Distance between gas blowing outlet and substrate: 3 cm Reddish purple luminescence was observed in the region where Zn(CH$_3$)$_2$, N$_2$O, and F$_2$ gas were merged into one stream. After gas blowing for 3 hours, a Zn:O:F film of about 2.0 μm thickness was deposited on the quartz glass substrate. The films were found to be amorphous when the substrate temperature was 400° C. and crystalline when the substrate temperature was 600° C. as confirmed by electron beam diffraction.

After an aluminum comb-shaped electrode (gap length 200 μm) was vapor deposited in vacuo on the Zn:O:F film, the sample was placed in a vacuum cryostat, and dark electroconductivity ($\sigma d$), electroconductivity ($\sigma p$) when irradiated with light of 600 nm and 0.3 mw/cm$^2$ and the optical band gap ($Eg_{opt}$) by measurement of optical absorption were measured, respectively.

The obtained values were as follows:

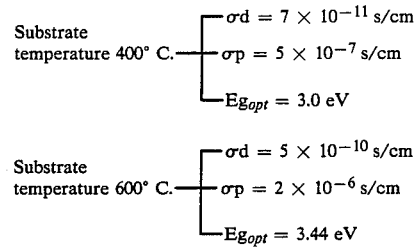

Substrate temperature 400° C.
- $\sigma d = 7 \times 10^{-11}$ s/cm
- $\sigma p = 5 \times 10^{-7}$ s/cm
- $Eg_{opt} = 3.0$ eV Substrate temperature 600° C.
- $\sigma d = 5 \times 10^{-10}$ s/cm
- $\sigma p = 2 \times 10^{-6}$ s/cm
- $Eg_{opt} = 3.44$ eV The film thickness, $\delta d$, $\delta p$, and $Eg_{opt}$ were measured in the same manner as in Example 1.

EXAMPLES 5-8

Examples 1-4 were repeated except that Cd(CH$_3$)$_2$ was filled in the starting material vessel 107 in place of Zn(CH$_3$)$_2$ to carry out film formation. These results are shown in Table 2.

The film thickness, $\delta d$, $\delta p$, and $Eg_{opt}$ were measured in the same manner as in Example 1.

TABLE 2

| Example | Starting material gas | Flow rate (SCCM) | Inner pressure (Torr) | Substrate temperature (°C.) | Deposition speed (Å/s) | Film thickness (μm) | Characteristics $\sigma p$(scm$^{-1}$) $\sigma d$(scm$^{-1}$) | $Eg_{opt}$ (eV) |
|---|---|---|---|---|---|---|---|---|
| 5 | Cd(CH$_3$)$_2$ SeH$_2$ F$_2$ from bomb 101 | 0.001 mol/min 20 5 20 | 750 m | 400 | 1.5 | 1.7 | $5 \times 10^{-11}$ $8 \times 10^{-6}$ $9 \times 10^{-11}$ | 1.60 |

TABLE 2-continued

| Example | Starting material gas | | Flow rate (SCCM) | Inner pressure (Torr) | Substrate temperature (°C.) | Deposition speed (Å/s) | Film thickness (μm) | Characteristics $\sigma p(scm^{-1})$ $\sigma d(scm^{-1})$ | $Eg_{opt}$ (eV) |
|---|---|---|---|---|---|---|---|---|---|
| | He | from bomb 105 | 40 | | 600 | 1.7 | 1.9 | $3 \times 10^{-5}$ | 1.85 |
| 6 | Cd(CH$_3$)$_2$ H$_2$S F$_2$ | | 0.001 mol/min 15 5 | 750 m | 400 | 1.3 | 1.8 | $6 \times 10^{-11}$ $5 \times 10^{-6}$ | 2.35 |
| | He | from bomb 101 from bomb 105 | 20 40 | | 600 | 1.5 | 1.9 | $9 \times 10^{-12}$ $3 \times 10^{-6}$ | 2.60 |
| 7 | Cd(CH$_3$)$_2$ TeH$_2$ F$_2$ | | 0.001 mol/min 20 5 | 750 m | 400 | 1.8 | 2.1 | $6 \times 10^{-12}$ $7 \times 10^{-7}$ | 1.40 |
| | He | from bomb 101 from bomb 105 | 20 40 | | 600 | 2.0 | 2.3 | $2 \times 10^{-11}$ $3 \times 10^{-7}$ | 1.61 |
| 8 | Cd(CH$_3$)$_2$ N$_2$O F$_2$ | | 0.001 mol/min 15 5 | 750 m | 400 | 1.1 | 1.5 | $3 \times 10^{-11}$ $8 \times 10^{-6}$ | 2.15 |
| | He | from bomb 101 from bomb 105 | 20 40 | | 600 | 1.3 | 1.7 | $9 \times 10^{-11}$ $2 \times 10^{-6}$ | 2.55 |

EXAMPLES 9, 10

Examples 1 and 3 were repeated except that Hg(CH$_3$)$_2$ was filled in the starting material vessel 107 in place of Zn(CH$_3$)$_2$ to carry out film formation. These results are shown in Table 3.

TABLE 3

| Starting material gas | | Flow rate (SCCM) | Inner pressure (Torr) | Substrate temperature (°C.) | Deposition speed (Å/s) | Film thickness (μm) | Characteristics $\sigma p(scm^{-1})$ $\sigma d(scm^{-1})$ | $Eg_{opt}$ (eV) |
|---|---|---|---|---|---|---|---|---|
| Hg(CH$_3$)$_2$ SeH$_2$ F$_2$ | | 0.001 mol/min 20 5 | 1.1 | 400 | 0.8 | 1.4 | $7 \times 10^{-9}$ $8 \times 10^{-7}$ | 0.21 |
| He | from bomb 101 from bomb 105 | 20 40 | | 600 | 1.0 | 1.6 | $2 \times 10^{-9}$ $1 \times 10^{-7}$ | 0.30 |
| Hg(CH$_3$)$_2$ TeH$_2$ F$_2$ | | 0.001 mol/min 15 5 | 1.2 | 400 | 1.1 | 1.5 | $8 \times 10^{-9}$ $5 \times 10^{-6}$ | 0.10 |
| He | from bomb 101 from bomb 105 | 20 40 | | 600 | 1.2 | 1.8 | $3 \times 10^{-9}$ $9 \times 10^{-6}$ | 0.15 |

As can be seen from the detailed description and the respective examples set forth above, according to the deposition film-forming method of the present invention, deposited films having uniform physical properties over a large area can be obtained with easy management of film quality at the same time as achievement of energy saving. Also, it is possible to obtain easily films excellent in productivity and bulk productivity, and having high quality with excellent physical properties such as electrical, optical, and semiconductor properties, etc.

What we claim is:

1. A method for forming a deposited film comprising: introducing separately into a reaction space (a) a gaseous starting material containing an element of Group IIB of the periodic table for formation of a deposited film, (b) a gaseous starting material containing an element of Group VIA of the periodic table for formation of a deposited film, and (c) a gaseous halogenic oxidizing agent capable of oxidizing said starting materials and selected from the group consisting of F$_2$, Cl$_2$, Br$_2$ and I$_2$, thereby forming a mixture and effecting contact therebetween to chemically form a plurality of precursors including precursors in an excited state, and forming a deposited film on a substrate in a film-forming space without the use of external discharge energy in the film-forming space and with at least one of said precursors as a field source for the constituent element of said deposited film.

2. A method for forming a deposited film according to claim 1, wherein said element in Group IIB of the periodic table is Zn, Cd or Hg.

3. A method for forming a deposited film according to claim 1, wherein said element in Group VIA of the periodic table is O, S, Se or Te.

4. A method for forming a deposited film according to claim 1, wherein said gaseous halogenic oxidizing agent is fluorine gas.

5. A method for forming a deposited film according to claim 1, wherein said gaseous halogenic oxidizing agent is chlorine gas.

6. A method for forming a deposited film according to claim 1, wherein said gaseous halogenic oxidizing agent is a halogen under nascent state.

7. A method for forming a deposited film according to claim 1, wherein said substrate is arranged at a position opposed to the direction in which said gaseous starting materials and said gaseous halogenic oxidizing agent are introduced into said reaction space.

8. A method for forming a deposited film according to claim 1, wherein said gaseous starting materials and said gaseous halogenic oxidizing agent are introduced into said reaction space through a transporting pipe of a multi-tubular structure.

* * * * *

UNITED STATES PATENT AND TRADEMARK OFFICE
CERTIFICATE OF CORRECTION

PATENT NO. : 4,869,931
DATED : September 26, 1989
INVENTOR(S) : MASAAKI HIROOKA, ET AL.

Page 1 of 4

It is certified that error appears in the above-identified patent and that said Letters Patent is hereby corrected as shown below:

COLUMN 1

Line 12, "for" should be deleted.
　　Line 13, "device" should read --devices--.
　　Line 15, "device," should read --devices,--.

COLUMN 2

Line 3, "the the" should read --the--.
　　Line 37, "Group II" should read --of Group II--.
　　Line 38, "in the" should read --of--.
　　Line 48, "DRAWINGS" should read --DRAWING--.

COLUMN 3

Line 1, "table" should read --table,--.
　　Line 2, "film" should read --film,-- and "action" should be deleted.
　　Line 45, "the" should read --its--.

COLUMN 4

Line 20, "ship." should read --ships.--.
　　Line 32, "agent in probability." should read --agent.--.
　　Line 55, "large scale" should read --large-scale--.
　　Line 67, "large scale" should read --large-scale--.

UNITED STATES PATENT AND TRADEMARK OFFICE
CERTIFICATE OF CORRECTION

PATENT NO. : 4,869,931
DATED : September 26, 1989
INVENTOR(S) : MASAAKI HIROOKA, ET AL.

It is certified that error appears in the above-identified patent and that said Letters Patent is hereby corrected as shown below:

COLUMN 5

Line 20, "tion," should read --tion--.

COLUMN 6

Line 17, "to" should be deleted.

COLUMN 7

Line 32, "described" should read --is described--.

COLUMN 8

Line 4, "crystalling" should read --crystalline--.

UNITED STATES PATENT AND TRADEMARK OFFICE
CERTIFICATE OF CORRECTION

PATENT NO. : 4,869,931

DATED : September 26, 1989

INVENTOR(S) : MASAAKI HIROOKA, ET AL.

Page 3 of 4

It is certified that error appears in the above-identified patent and that said Letters Patent is hereby corrected as shown below:

COLUMN 11

TABLE 3, "

| Starting material gas |
|---|
| $Hg(CH_3)_2$ |
| $SeH_2$ |
| $F_2$ |
| He $\begin{cases} \text{from bomb 101} \\ \text{from bomb 105} \end{cases}$ |
| $Hg(CH_3)_2$ |
| $TeH_2$ |
| $F_2$ |
| He $\begin{cases} \text{from bomb 101} \\ \text{from bomb 105} \end{cases}$ "| should read

| Example | Starting material gas |
|---|---|
| 9 | $Hg(CH_3)_2$ $SeH_2$ $F_2$ He $\begin{cases} \text{from bomb 101} \\ \text{from bomb 105} \end{cases}$ |
| 10 | $Hg(CH_3)_2$ $TeH_2$ $F_2$ He $\begin{cases} \text{from bomb 101} \\ \text{from bomb 105} \end{cases}$ --. |

UNITED STATES PATENT AND TRADEMARK OFFICE
CERTIFICATE OF CORRECTION

PATENT NO. : 4,869,931

DATED : September 26, 1989

INVENTOR(S) : MASAAKI HIROOKA, ET AL.

Page 4 of 4

It is certified that error appears in the above-identified patent and that said Letters Patent is hereby corrected as shown below:

COLUMN 11

Line 57, "film" should read --film,--.

COLUMN 12

Line 26, "field source" should read --feed source--.
Line 58, "a halogen" should be deleted.

Signed and Sealed this

Fourth Day of June, 1991

Attest:

HARRY F. MANBECK, JR.

Attesting Officer

Commissioner of Patents and Trademarks